United States Patent
Nishikata

[11] Patent Number: 5,998,851
[45] Date of Patent: Dec. 7, 1999

[54] OPTICAL WAVEGUIDE TYPE PHOTODIODE AND A PROCESS OF PRODUCING THE SAME

[75] Inventor: Kazuaki Nishikata, Yokosuka, Japan

[73] Assignee: The Furukawa Electric Co., Ltd., Tokyo, Japan

[21] Appl. No.: 08/982,091

[22] Filed: Dec. 1, 1997

[30] Foreign Application Priority Data

Dec. 4, 1996 [JP] Japan ..................................... 8-324246

[51] Int. Cl.⁶ ................. H01L 31/0232; H01L 31/0304; H01L 31/072
[52] U.S. Cl. .......................... 257/436; 257/184; 257/464; 257/465
[58] Field of Search .................... 257/184, 436, 257/464, 465

[56] References Cited

U.S. PATENT DOCUMENTS 3,993,963  11/1976  Logan et al. .......................... 257/184

FOREIGN PATENT DOCUMENTS 3-120876  5/1991  Japan .
4-255270  9/1992  Japan ..................................... 257/184

*Primary Examiner*—Jeroma Jackson, Jr.
*Attorney, Agent, or Firm*—Frishauf, Holtz, Goodman, Langer & Chick, P.C.

[57] ABSTRACT

An optical waveguide type photodiode has a plurality of semiconductor layers formed one upon another on a semiconductor substrate and including an optical absorption layer sandwiched between a pair of optical confinement layers for guiding incident light in parallel with the semiconductor layers, wherein a light absorption quantity per unit length of an optical waveguide area constituted by the optical absorption layer is substantially constant throughout the entire area thereof. Specifically, the optical confinement factor $\Gamma(x)$ of the optical waveguide area is set so as to increase with guided distance x of light. Preferably, a device structure is employed in which the thickness $d(x)$ of the optical absorption layer increases with the guided distance x of light. Also, the optical absorption layer is formed by selective area growth with the use of a pair of selective area growth masks, and these masks have a mask pattern such that the mask width thereof gradually decreases/increases in the light guiding direction, whereby a photodiode with the above device structure can be fabricated with ease.

4 Claims, 6 Drawing Sheets

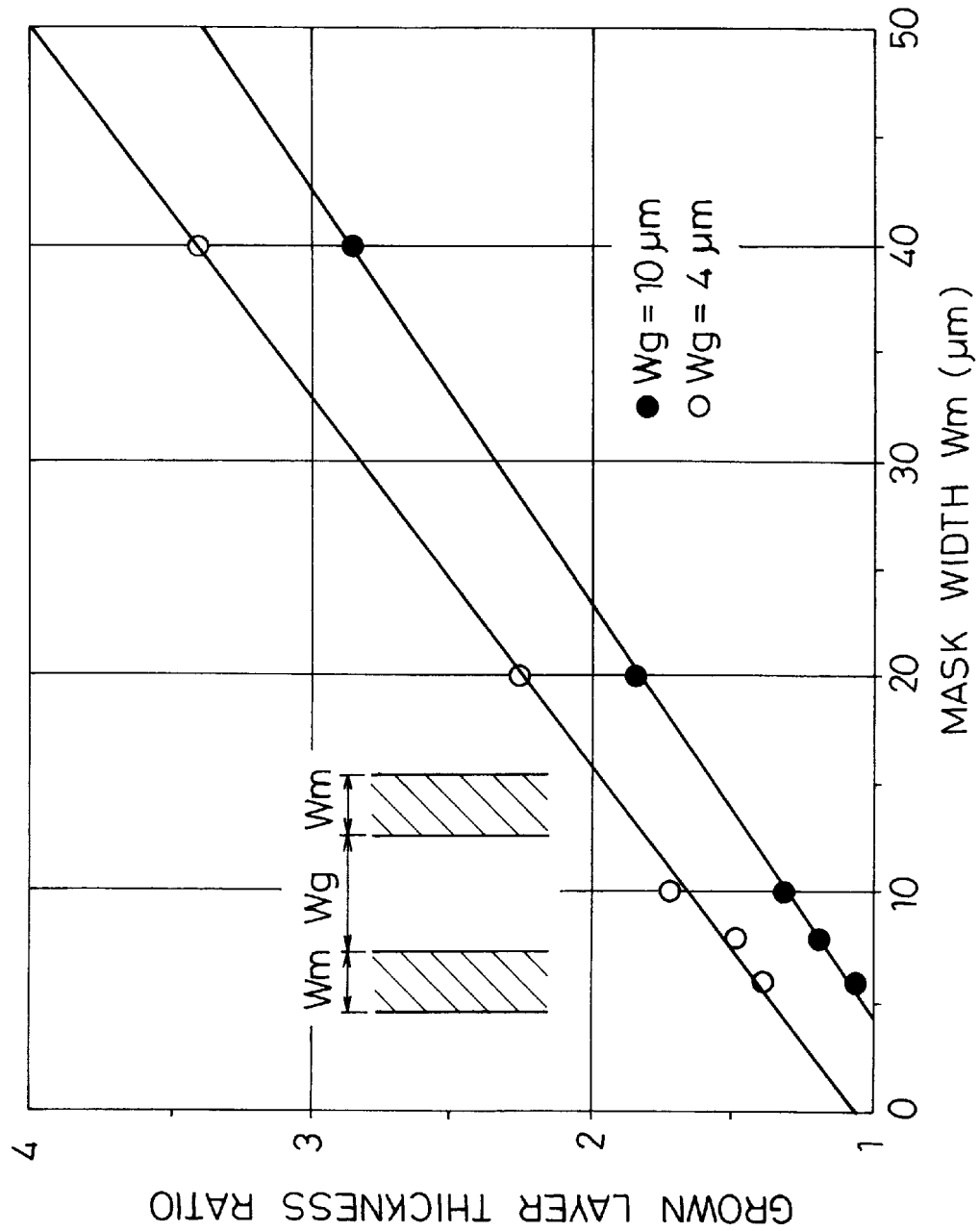

$\Gamma(x) = \dfrac{2.1}{71-x}$ $$\Gamma(x) = \frac{2.5}{125-x}$$

OPTICAL WAVEGUIDE TYPE PHOTODIODE AND A PROCESS OF PRODUCING THE SAME

BACKGROUND OF THE INVENTION

1. Field of the Invention

The present invention relates to an optical waveguide type photodiode having a plurality of semiconductor layers which are formed one upon another on a semiconductor substrate and which include an optical absorption layer sandwiched between a pair of optical confinement layers for guiding light in parallel with the semiconductor layers. More particularly, the present invention relates to a photodiode which is quick in responsivity, ensures low modulation distortion with respect to incident light and thus is suited for large-capacity optical communications, and to a process of producing such a photodiode.

2. Description of the Related Art

In the field of optical communications using a long wavelength region, pin photodiodes of surface-incident type are widely used. The surface-incident photodiode absorbs light at the surface of a semiconductor layer (optical absorption layer), so that many photo carriers are locally generated in the vicinity of the surface of the optical absorption layer. With the surface-incident photodiode, therefore, modulation distortion with respect to incident light is liable to occur. Also, in surface-incident photodiodes in general, GaInAs semiconductor is used for the optical absorption layer. Since GaInAs semiconductor has a large absorption coefficient with respect to light with a wavelength of 1.3 µm or 1.55 µm, the modulation distortion mentioned above poses a serious problem.

Optical waveguide type photodiodes, on the other hand, have a basic device structure shown in FIG. 1, wherein a plurality of semiconductor layers including an n-type cladding layer 2, an n-type optical confinement layer 3, an optical absorption layer 4, a p-type optical confinement layer 5, and p-type cladding layer 6 are successively formed on a emiconductor substrate 1. The optical confinement layers 3 and 5 are each made of a conductive semiconductor having a refractive index lower than that of the optical absorption layer 4.

In the optical waveguide type photodiode with the above device structure, as light incident on the front facet of the semiconductor layers is guided in parallel with these layers, its light energy is absorbed by the optical absorption layer 4, and carriers excited by the thus-absorbed energy are detected as a photocurrent. Compared with the surface-incident type photodiode, the optical waveguide type photodiode has a thinner optical absorption layer 4, and thus the transit time of photo carriers is short, permitting high-speed operation.

Generally, the thickness (film thickness) of the optical absorption layer 4 of the optical waveguide type photodiode is set to 2 µm or more in order to enhance the light sensitivity. Accordingly, light introduced into the optical absorption layer 4 is absorbed in large part in a region near the front facet while being guided for only a relatively short distance. As a result, a large number of photo carriers are generated locally in the vicinity of the front facet of the optical absorption layer 4, and such local generation of photo carriers causes modulation distortion.

SUMMARY OF THE INVENTION

A photodiode according to the present invention is based on the technical concept explained below. The aforementioned surface-incident type photodiode is produced using bulk crystalline materials, and thus its optical absorption coefficient is determined by the crystalline material (semiconductor material) forming the optical absorption layer. In the surface-incident photodiode, therefore, the optical absorption coefficient cannot be changed even if the device structure is elaborated. By contrast, the optical waveguide type photodiode has a device structure in which an optical waveguide is formed by an optical absorption layer sandwiched between a pair of optical confinement layers. The optical absorption coefficient of the optical waveguide is determined as a value $\Gamma\alpha$ which is the product of a value a intrinsic to the semiconductor material forming the optical absorption layer and an optical confinement factor $\Gamma$ determined by the structure of the optical waveguide. Thus, by elaborating the optical waveguide structure, it is possible to change the optical confinement factor $\Gamma$ of the optical waveguide and thereby lower the optical absorption coefficient $\Gamma\alpha$.

According to the present invention, the optical waveguide structure is gradually varied in the light guiding direction to make the optical confinement factor $\Gamma$ different at different portions of the optical waveguide and thereby cause the optical absorption coefficient $\Gamma\alpha$ to vary depending on a guided distance x of light, so that light may be absorbed uniformly over the entire area of the optical waveguide. Namely, an optical waveguide structure is constructed in which light is not locally absorbed in a region in the vicinity of the light incident front facet. More specifically, the optical waveguide type photodiode according to the present invention has a waveguide structure such that the optical confinement factor $\Gamma$ is small at the light incident front facet and gradually increases with distance x from the light incident front facet, whereby the light absorption quantity (absorbed energy) per unit length is made substantially constant throughout the entire area of the optical waveguide.

In the example shown in FIG. 1, the photodiode has an optical waveguide structure which is uniform throughout the entire area, and thus the optical confinement factor $\Gamma$ remains the same at any portion of the optical waveguide. Accordingly, the optical absorption coefficient $\Gamma\alpha$ of the optical waveguide (optical absorption layer) also remains constant throughout the entire area thereof. Consequently, the optical waveguide has a light absorption characteristic such that the light absorption quantity is large in the vicinity of the front facet and gradually decreases with guided distance x, as indicated by characteristic A in FIG. 2. In this regard, if the optical waveguide structure is modified in the aforementioned manner such that the optical confinement factor $\Gamma$ varies depending on the guided distance x, then it is possible to make the light absorption quantity per unit length constant, as indicated by characteristic B in FIG. 2.

In order to make the light absorption quantity per unit length constant throughout the entire area of the optical waveguide, an optical confinement factor $\Gamma(x)$ of the optical waveguide as a function of the guided distance x will be considered. Provided that the intensity of light introduced into a region with a unit length dx of the optical absorption layer having an absorption coefficient of $\alpha$ is $P(x)$, the quantity $dP(x)$ of light absorbed in this region is given by $$-dP(x) = \alpha P(x) dx \quad (1)$$

Given that the intensity of light incident on the front facet is Po, since the light is absorbed at a rate of absorption coefficient $\alpha\Gamma(x)$ which is a function of the guided distance x, the intensity $P(x)$ of light introduced into the above region is $$P(x) = P_o \exp(-\alpha \int_0^x \Gamma(x) dx) \quad (2)$$

Accordingly, to make the quantity dP(x) of light absorption in the above region constant regardless of the guided distance x, the optical confinement factor Γ(x) may be set so that the value obtained by differentiating equation (2) for the guided distance x, that is, the rate of light absorption indicated by $$\Gamma(x) \exp\left(-\alpha \int_0^x \Gamma(x) dx\right) \quad (3)$$

may become constant.

As one solution to this, according to the present invention, the optical confinement factor Γ(x) indicated, for example, by $$\Gamma(x) = \frac{C_1}{C_2 - x} \quad (4)$$

as shown in FIG. 3, is set as a function of the distance (guided distance) x from the light incident front facet, and in this case the light absorption quantity per unit length can be made constant, as indicated by characteristic B in FIG. 2.

Also, the present invention is based on the knowledge that, in the optical waveguide type photodiode having the device structure shown in FIG. 1, the thickness d of the optical absorption layer 4 and the optical confinement factor Γ have a nearly linear relationship, as shown in FIG. 4, especially in a region of the optical absorption layer 4 having a thickness d of 0.1 μm or less. As a consequence, it was found that in order to fulfill the relationship shown in equation (4) above, the thickness d(x) of the optical absorption layer 4 as a function of the guided distance x may be set as follows:

$$d(x) = \frac{C_3}{C_4 - x} \quad (5)$$

The optical waveguide type photodiode according to the present invention is obtained based on the technical knowledge described above, and has a device structure in which a plurality of semiconductor layers formed one upon another on a semiconductor substrate include an optical absorption layer and a pair of optical confinement layers sandwiching the optical absorption layer therebetween, the optical absorption layer and the pair of optical confinement layers forming an optical waveguide. The present invention is characterized especially in that the light absorption quantity per unit length of the optical waveguide is substantially constant throughout the entire area of the optical waveguide. Namely, the object of the present invention is to provide an optical waveguide type photodiode having a waveguide structure in which the light absorption quantity per unit length of the optical waveguide is made substantially constant so that light incident on and introduced into the optical waveguide may be absorbed at a constant rate over the entire area of the optical waveguide.

To achieve the object, the present invention provides a photodiode having a waveguide structure in which the optical confinement factor Γ(x) of the optical waveguide is set so as to increase with distance x from the light incident front facet of the optical waveguide, thereby making the light absorption quantity per unit length substantially constant.

Also, to achieve the above object, the present invention provides a photodiode having a waveguide structure in which the thickness d(x) of the optical absorption layer is set so as to increase with the distance x from the light incident front facet of the optical waveguide, whereby the optical absorption coefficient Γα varies in the light guiding direction so that the light absorption quantity per unit length may be substantially constant.

With the optical waveguide type photodiode having the aforementioned waveguide structure, light energy is absorbed substantially uniformly over the entire area of the optical waveguide, whereby inconveniences such as local generation of photo carriers in large quantities are prevented and also the modulation distortion is suppressed. Further, since light energy is absorbed in the entire area of the optical waveguide, it is possible to provide an optical waveguide type photodiode having a thin optical absorption layer and yet having sufficiently high photo sensitivity.

A photodiode production process according to the present invention comprises the steps mentioned below. After a first optical confinement layer made of a semiconductor having a first conductivity is formed on a semiconductor substrate [first step], a pair of selective area growth masks are formed on the first optical confinement layer in such a manner that a photodiode forming area on which a photodiode is to be formed is situated between the masks [second step]. The masks have a mask pattern whose mask width decreases/increases in a direction perpendicular to the direction of interposition of the photodiode forming area between the masks. Then, using the masks, an optical absorption layer is selectively grown on the first optical confinement layer [third step]. The optical absorption layer is made of a semiconductor having a smaller energy gap than that of the first optical confinement layer. Then, after the masks are removed, a second optical confinement layer made of a semiconductor having a second conductivity is formed on the optical absorption layer [fourth step]. The semiconductor forming the second optical confinement layer is opposite in conductivity to the first optical confinement layer and has a greater energy gap than that of the optical absorption layer.

Thus, in the photodiode production process according to the present invention, the optical absorption layer is selectively grown using a pair of selective area growth masks whose mask width gradually increases/decreases in a longitudinal direction thereof, whereby the thickness and composition of the optical absorption layer are made to gradually vary in the light guiding direction which is the longitudinal direction of the optical absorption layer. This process permits easy and high-accuracy production of photodiodes having a waveguide structure such that the light energy absorption quantity per unit length of the optical waveguide is substantially constant over the entire area of the waveguide.

BRIEF DESCRIPTION OF THE DRAWINGS

FIG. 6 is a graph showing how the ratio in thickness between semiconductor films grown on an area situated between a pair of selective area growth masks and on an area not situated between the masks is dependent on the width Wm of the masks;

DETAILED DESCRIPTION OF THE INVENTION

Figure 1:
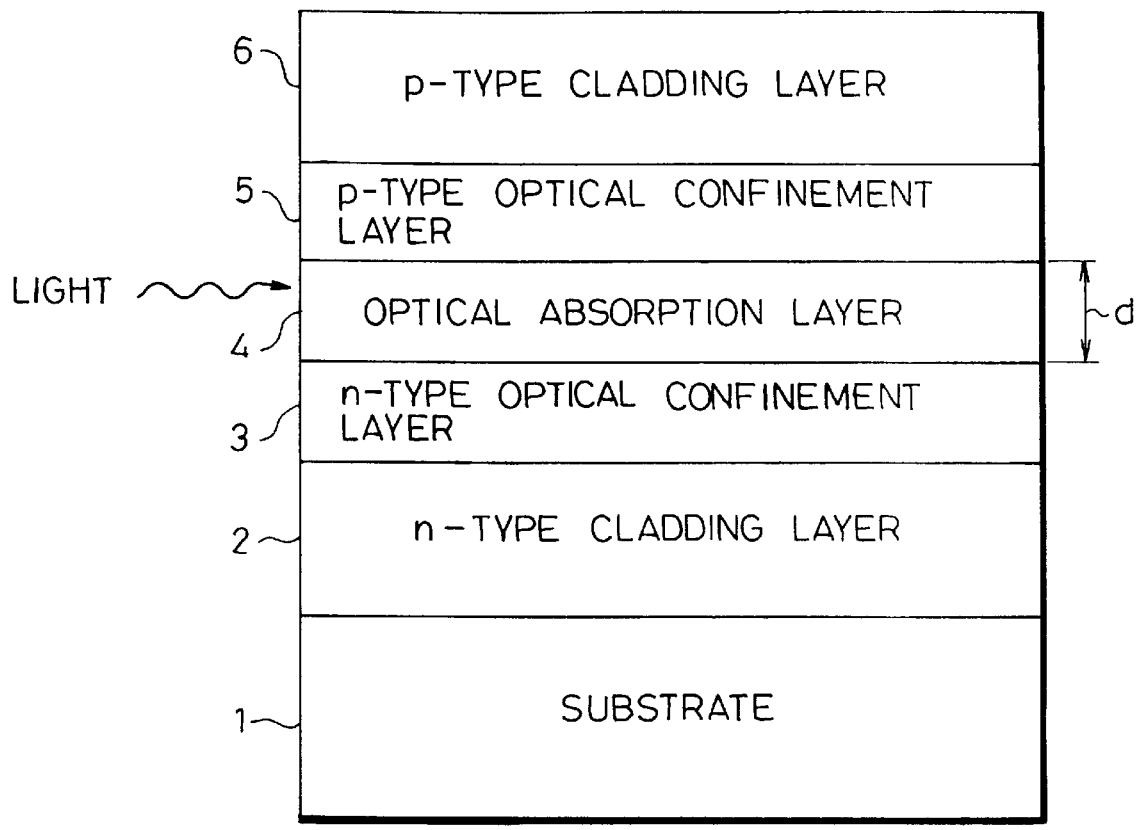
FIG. 1 is a diagram showing a basic device structure of an optical waveguide type photodiode.
Figure 2:
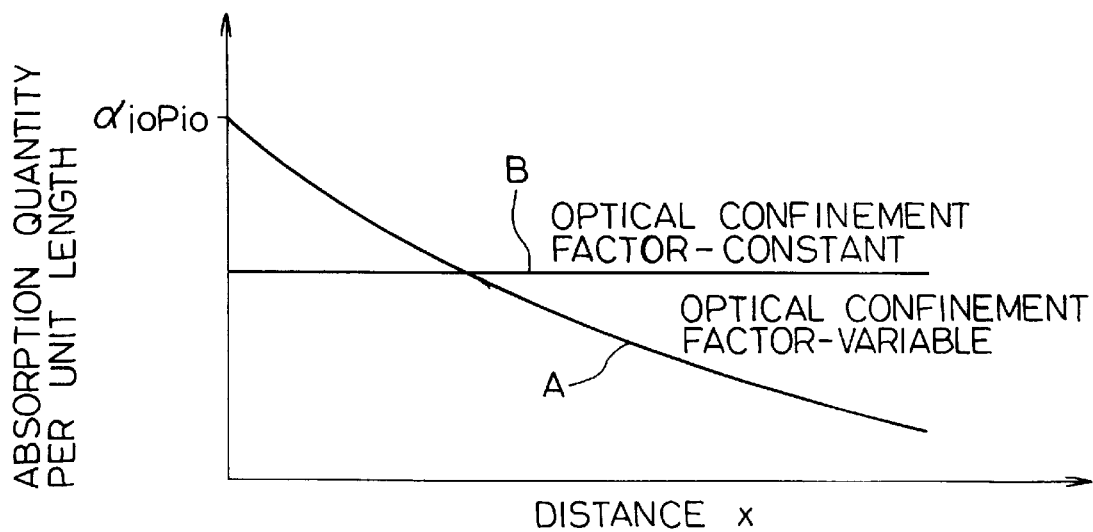
FIG. 2 is a graph showing how the light absorption quantity per unit length varies with a guided distance x, depending on optical confinement factor.
Figure 3:
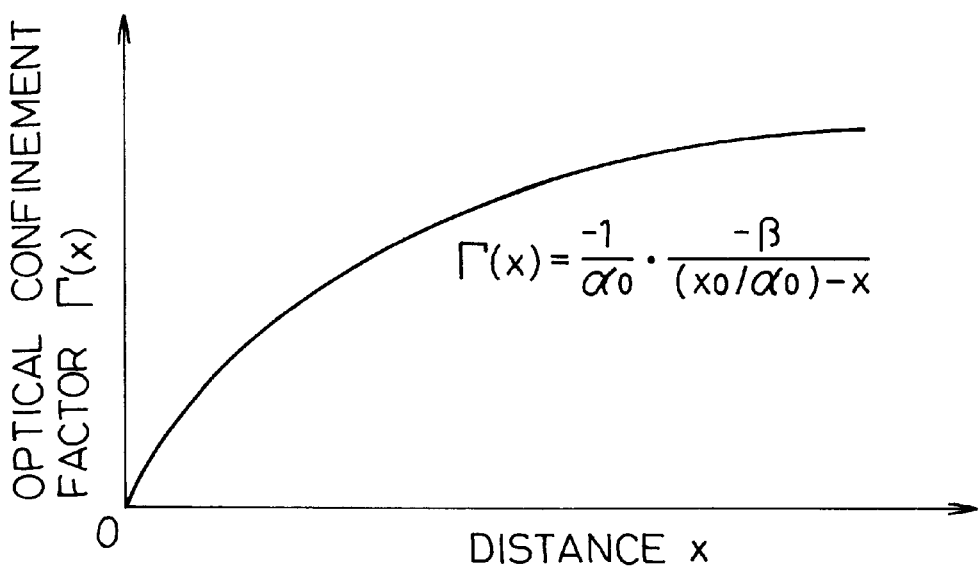
FIG. 3 is a graph showing a characteristic curve of the optical confinement factor Γ(x) which changes with the guided distance x so as to maintain the light absorption quantity per unit length constant.
Figure 4:
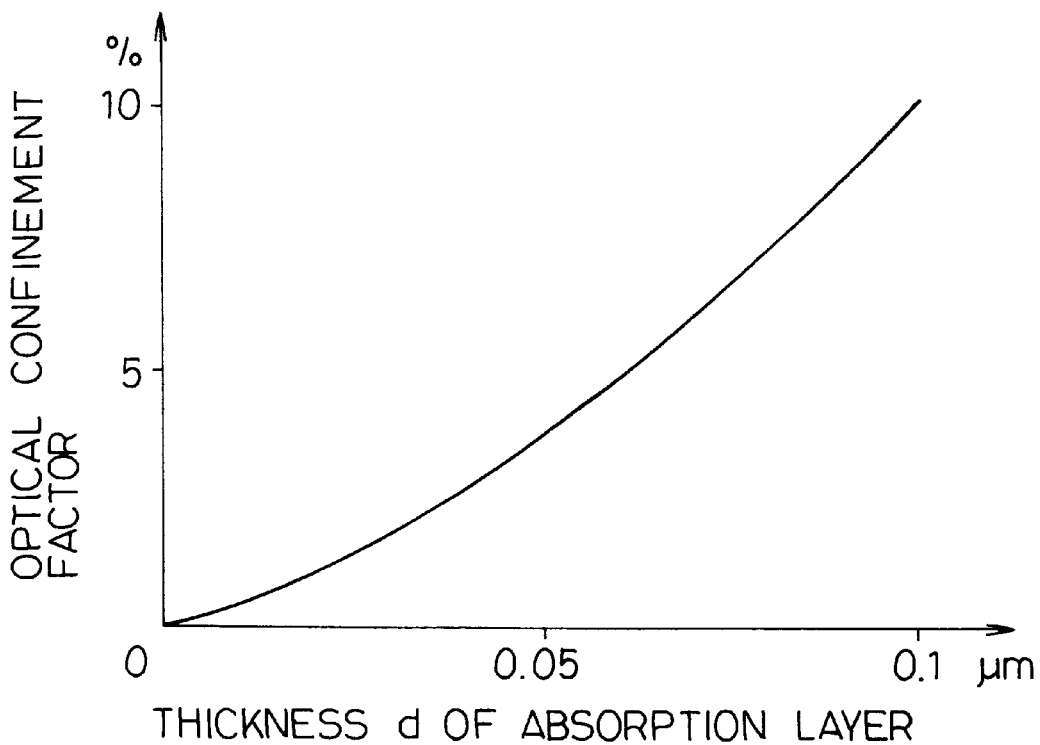
FIG. 4 is a graph showing the relationship between the thickness d of an optical absorption layer and the optical confinement factor Γ(x)
Figure 5:
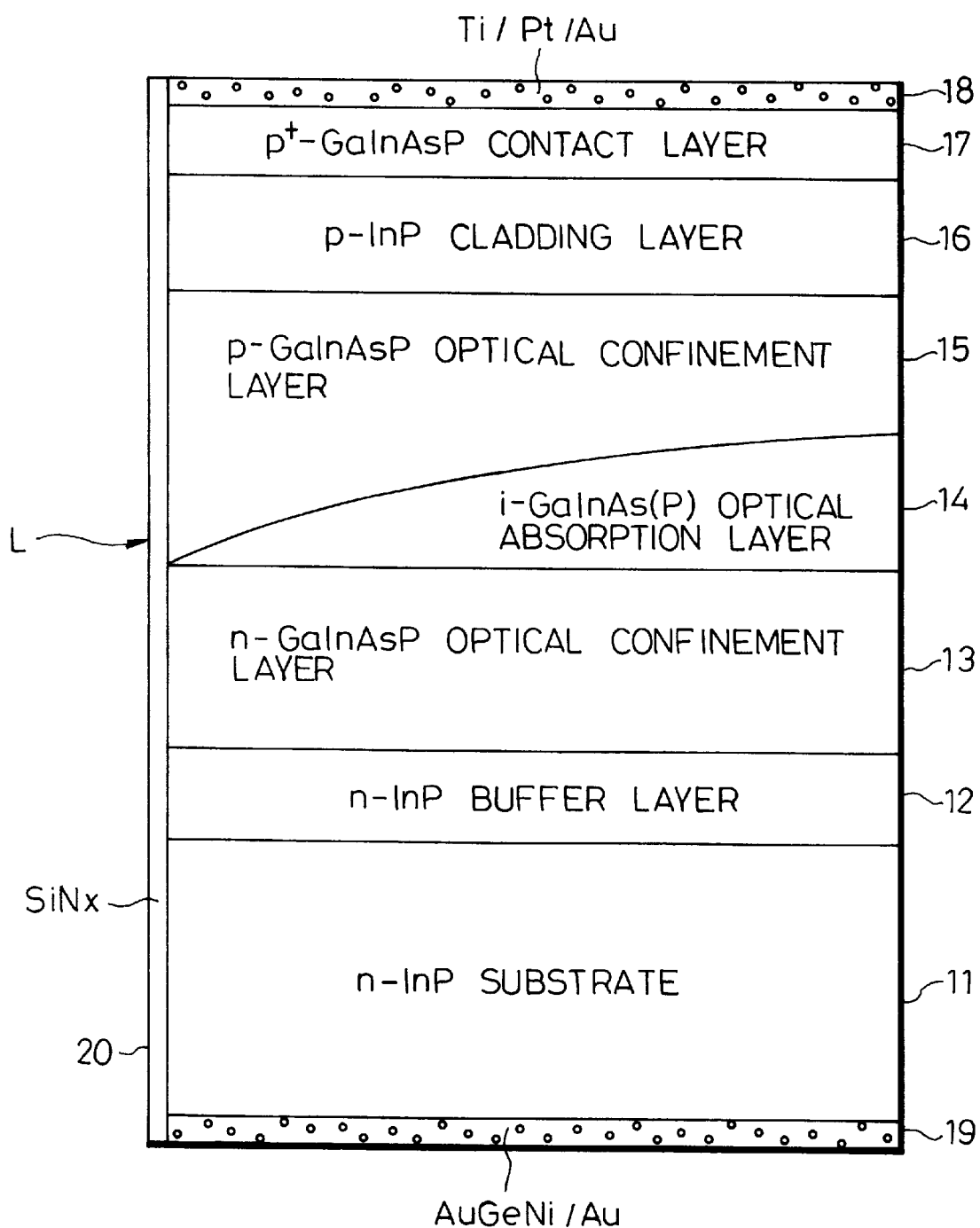
FIG. 5 is a diagram showing a device structure of a photodiode according to one embodiment of the present invention.

An optical waveguide type photodiode according to one embodiment of the present invention has a device structure shown in FIG. 5, for example, wherein a plurality of semiconductor layers including a pair of optical confinement layers, an optical absorption layer, etc. are successively formed by crystal growth on an n-InP substrate 11 having a carrier density of $4\times10^{18}$ cm$^{-3}$.

Specifically, a buffer layer 12 formed on the n-InP substrate 11 and having a thickness of 1 μm is made of n-InP having a carrier density of $2\times10^{18}$ cm$^{-3}$. A first optical confinement layer 13, which is formed on the buffer layer 12 and is 2 μm thick, is made of, for example, n-GaInAsP having a carrier density of $1\times10^{18}$ cm$^3$ and having a band gap wavelength of 1.25 μm. An optical absorption layer 14 formed on the first optical confinement layer 13 is made of undoped GaInAs having a band gap wavelength of 1.65 μm. The thickness d(x) of the optical absorption layer 14 varies with distance x from an front facet thereof in accordance with equation (5) mentioned above. The optical absorption layer 14 of which the thickness d(x) varies with the distance x from its front facet is formed by epitaxial growth on a selective area with the use of a pair of dielectric masks, as described later.

A second optical confinement layer 15, which is formed on the GaInAs optical absorption layer 14 and is 2 μm thick, is made of p-GaInAsP having a carrier density of $1\times10^{18}$ cm$^{-3}$ and having a band gap wavelength of 1.25 μm. A cladding layer 16 formed on the second optical confinement layer 15 and having a thickness of 2 μm is made of p-InP having a carrier density of $1\times10^{18}$ cm$^{-3}$. A contact layer 17, which is formed on the cladding layer 16 and is 0.4 μm in thickness, is made of p$^+$-GaInAsP having a carrier density of $2\times10^{19}$ cm$^{-3}$. The band gap wavelength of the p$^+$-GaInAsP contact layer 17 is 1.55 μm.

In FIG. 5, reference numeral 18 denotes a P electrode of Ti/Pt/Au ohmically deposited on the p$^+$-GaInAsP contact layer 17, and 19 denotes an N electrode of AuGeNi/Au deposited on the reverse side of the n-InP substrate 11. Further, reference numeral 20 represents a non-reflective film of SiN$_x$ deposited over on an front facets of the aforementioned semiconductor layers. Although not illustrated, a 0.4 μm-thick region having a carrier density of $1\times10^{16}$ cm$^{-3}$ is formed on and beneath the GaInAs optical absorption layer 14 as a junction interface with the optical confinement layers 13 and 15.

The individual semiconductor layers 12, 13, 15, 16 and 17 have their lattices matched with the n-InP substrate 11. The optical absorption layer 14 includes a lattice unmatched portion because it is formed by selective area growth, but the amount of lattice mismatching of the optical absorption layer 14 is as small as 1% or less. The thickness of the optical absorption layer 14 is restricted to a small value of 0.2 μm at the maximum, and accordingly, there is substantially no possibility of the device characteristics being deteriorated due to lattice mismatching.

The optical absorption layer 14, of which the thickness gradually varies with the distance x from its front facet as mentioned above, is formed by selective area growth of GaInAs with the use of a pair of dielectric masks whose width varies depending on the distance x. The selective area growth is achieved by a vapor-phase crystal growing process such as MOCVD (Metal Organic Chemical Vapor Deposition), MBE (Molecular Beam Epitaxy), gas source MBE, or CBE (Chemical Beam Epitaxy), utilizing the phenomenon that the presence of an area covered with a dielectric mask causes the rate of growth of a semiconductor layer on an exposed area, which is not covered with the dielectric mask, to vary depending on the width of the surrounding dielectric mask, with the result that the thickness and composition vary within the resultant semiconductor layer. Specifically, since no semiconductor layer is grown on the dielectric mask, the semiconductor material flying onto the dielectric mask flows into the exposed area with no dielectric mask thereon. Thus, the selective area growth of the optical absorption layer 14 is carried out while accelerating the rate of growth of the semiconductor layer on the exposed area by the inflow of the semiconductor material from the dielectric mask side.

Provided that the width of the area on which the semiconductor layer is to be grown is Wg and the width of a pair of selective growth dielectric masks formed on opposite sides of this area is Wm, the ratio in thickness between semiconductor layers grown on the area (selected area) situated between the pair of masks and on an area (non-selected area) which is not situated between the masks varies depending on the mask width Wm, as shown in FIG. 6. Namely, in the case where the width Wm of the pair of masks is small, there occurs almost no difference in thickness between the semiconductor layers grown respectively on the above two areas, as shown in FIG. 6. However, if the mask width Wm is large and thus the width Wg of the semiconductor layer-growing area (selected area) situated between the pair of masks is correspondingly small, then the thickness of the semiconductor layer grown on the selected area becomes large compared with that grown on the non-selected area.

In the case where GaInAs, for example, is grown by means of the selective area growth technique, since In has a greater diffusion length than Ga, the effect of accelerating the growth of the semiconductor layer is conspicuous. Accordingly, if the mask width Wm is large and GaInAs is selectively grown on the exposed area (selected area) with a narrow width Wg between the pair of masks, the proportion of In to the grown GaInAs layer becomes large, and the increased proportion of In induces a corresponding reduction in the energy gap of this area.

The thickness of the optical absorption layer 14 is controlled by actively utilizing the aforementioned feature of the selective area growth. Specifically, the thickness of the optical absorption layer 14 is gradually increased with the distance x from its front facet so that the absorption coefficient of the layer 14 may gradually increase with the distance x. Thus, a pseudo-absorption coefficient Γα of the optical waveguide is increased with the distance x, thereby obtaining an optical waveguide structure in which the light absorption quantity per unit length is almost constant.

A photodiode production process according to the present invention, which actively utilizes the selective area growth technique for the optical absorption layer 14, will be now explained. To produce the photodiode, first, the n-InP buffer layer 12 and the n-GaInAsP optical confinement layer 13 are successively formed on the n-InP substrate 11 by an MOCVD process, for example [first step]. Subsequently, an $SiN_x$ film of 0.12 μm thick is deposited on the n-GaInAsP optical confinement layer 13 by a PCVD process. This $SiN_x$ film is then subjected to photolithography to be shaped into a pattern as shown in FIG. 7a, for example, thereby obtaining a pair of selective area growth masks 21 [second step].

The pair of masks 21 are formed in such a manner that an area (photodiode forming area) of 20 μm wide and 50 μm long, for example, which is part of the optical absorption layer to be formed on the optical confinement layer 13, is situated between the pair of masks 21. Also, the pattern of the masks 21 has a shape such that the mask width Wm gradually increases from 5 μm at a light incident end up to 50 μm at the other terminal end. Basically, the pattern of the masks 21 may be such that the mask width Wm varies linearly; in this embodiment, however, the edges of the masks 21 are convexly curved, as shown in FIG. 7a, thus providing a gradual broadening of the mask width Wm.

Figure 7A:
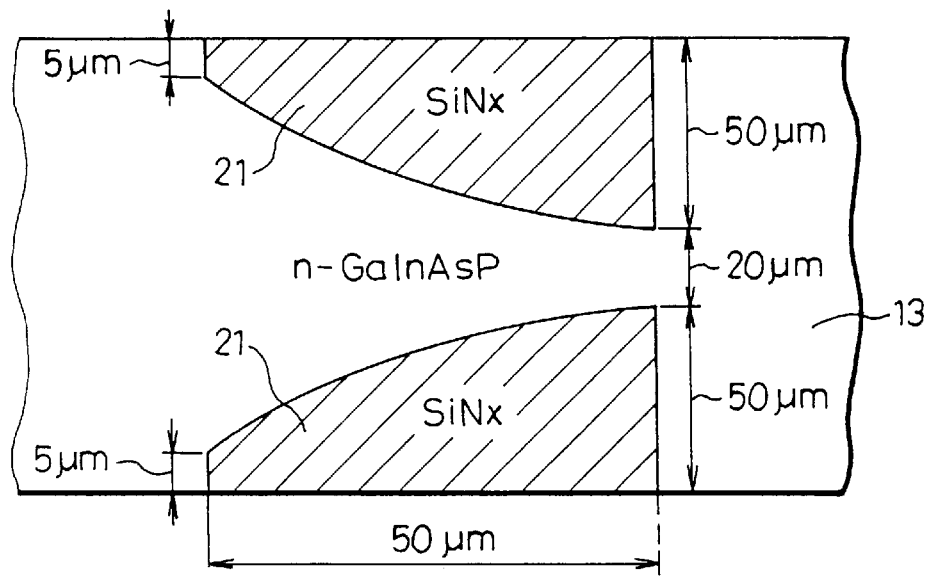
FIGS. 7a, 7b and 7c repectively are diagrams showing a pattern of a pair of masks used in producing a photodiode according to one embodiment of the present invention, change in the thickness of an optical absorption layer selectively grown by means of the masks, and change in the optical confinement factor.
Figure 7B:
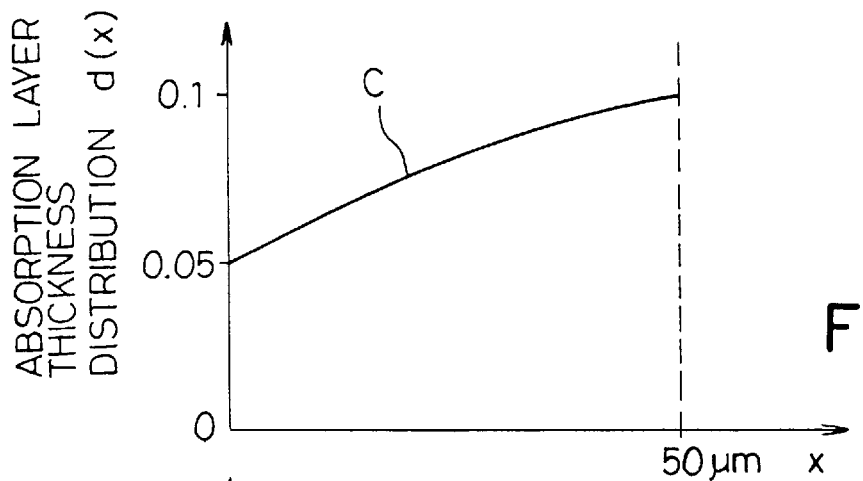

The pair of masks 21 having the pattern shown in FIG. 7 correspond to one photodiode (segment) to be formed on the semiconductor substrate 11. Accordingly, in cases where a plurality of photodiodes (segments) are to be collectively formed on the semiconductor substrate 11, a mask pattern may be used of which the overall shape consists of a plurality of basic patterns (pairs of masks 21) of FIG. 7a arranged at a predetermined pitch, though the illustration thereof is omitted.

Then, using the pair of masks 21, the optical absorption layer 14 of undoped GaInAs is selectively grown on the n-GaInAsP optical confinement layer 13 by an MOCVD process [third step] The selective area growth of the GaInAs optical absorption layer 14 is performed in such a manner that the thickness of the optical absorption layer 14 at the light incident end where the width Wm of the masks 21 is 5 μm is controlled to 0.05 μm. In this case, the composition of the GaInAs grown on an area not affected by the masks 21 at all (i.e., the area not situated between the masks 21) was set such that the resultant lattice was unmatched by approximately –0.2% from the latticematching condition. As a result, the GaInAs optical absorption layer 14 had a film thickness distribution characteristic C shown in FIG. 7b, and it was confirmed that the film thickness at the end terminal (rear facet) was approximately 0.1 μm.

Figure 7C:
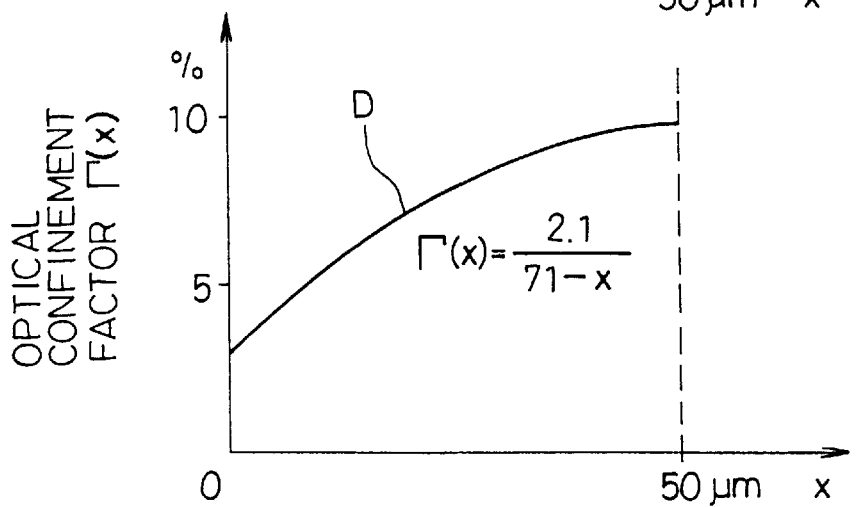

It was also confirmed by calculation that the optical confinement factor Γ(x) had a distribution characteristic D shown in FIG. 7c. As for the composition distribution of the GaInAs optical absorption layer 14, it was found that the band gap wavelength became longer with increase in the film thickness. Further, lattice mismatching of the GaInAs optical absorption layer 14 at the terminal end with a maximum thickness was approximately 0.2%.

Then, after the masks 21 composed of the $SiN_x$ film are removed by etching, the p-GaInAsP optical confinement layer 15 is grown on the GaInAs optical absorption layer 14 by an MOCVD process. Further, on the p-GaInAsP optical confinement layer 15 are successively formed the p-InP cladding layer 16 and the $p^+$-GaInAsP contact layer 17 [fourth step]. After these layers 15, 16 and 17 were grown, a level difference of about 0.05 μm attributable to the aforementioned film thickness distribution of the GaInAs optical absorption layer 14 was almost reduced and the surface of the uppermost layer was nearly flat.

Subsequently, the multiple semiconductor layers formed in the above manner are subjected to wet etching to shape the aforementioned photodiode forming area of 20 μm wide and 50 μm long into ridge stripe form. This step is carried out by setting a stripe of 15 μm wide so as to pass through the center of a light receiving area. Then, SiN is deposited on the semiconductor multilayer structure shaped into ridge stripe form (i.e., on the $p^+$-GaInAsP contact layer 17 which is the uppermost semiconductor layer), thereby performing a passivation process and an electrical insulation process. Further, polyimide is deposited on the SiN, and after the upper surface of the thus-deposited polyimide is flattened, only part of the polyimide in an area at which photodiodes are to be separated from each other is removed.

Then, a window for electrode contact is formed in the SiN and the polyimide remaining on the stripe and the P electrode 18 of Ti/Pt/Au is ohmically deposited in the window. The P electrode 18 is extended from the upper part of the stripe and is connected, for example, to a 50 μm-square bonding area. On the other hand, the reverse side of the n-InP substrate 11 is polished for adjustment of the thickness thereof, and the N electrode 19 of AuGeNi/Au is ohmically deposited on the reverse side.

Subsequently, the multiple semiconductor layers are cleaved perpendicularly to the stripe at a location corresponding to the end of the photodiode forming area, that is, at a location where the thickness of the GaInAs optical absorption layer 14 is the smallest, thereby obtaining a photodiode bar having a flat light incident surface. Thus, the stripe is restricted in length to 50 μm. Then, the non-reflective film 20 of $SiN_x$ is deposited on the cleaved surface which later serves as the light incident front facet, and the photodiode bar is cut to obtain individual separate photodiodes (segments).

Using the photodiode fabricated in this manner, a single-mode optical fiber was butt-jointed to the incident front facet of the photodiode, and light was introduced into the photodiode via the optical fiber to measure the light sensitivity. As a result, it was found that under a maximum coupling condition, the light sensitivity was 0.95 A/W for light with a wavelength of 1.55 μm and was 0.9 A/W for light with a wavelength of 1.3 μm. Also, the length of the photodiode was varied on purpose to restrict the stripe length, and the light sensitivity of the photodiode was measured to examine the light absorption quantity. It was confirmed that the light absorption quantity per unit length was constant.

Further, the photodiode was examined as to second- and third-order intermodulation distortions by an optical heterodyne method. Under operating conditions of modulation frequencies of 244 MHz and 250 MHz, modulation factor of 70% and average input optical power of 0 dBm, the second- and third-order modulation distortions were –90 dBc and –110 dBc on the average. These values signify excellent performance as compared with conventional photodiodes generally employed, proving that with the photodiode of the present invention, the modulation distortion is remarkably suppressed. Also, the modulation distortion was examined with the degree of coupling between the photodiode and the optical fiber changed, and no substantial deterioration in the modulation distortion was observed.

Moreover, reduction in the light sensitivity of the photodiode caused by displacement of the connecting portions of the photodiode and the optical fiber was examined. Where the connecting portions were displaced from each other by ±3 μm with respect to the maximum coupling position, the observed reduction in the light sensitivity was as low as 0.5 dB. In other words, an allowable displacement range of as large as ±3 μm is ensured for the connection between the photodiode and an optical fiber, and this is extremely useful in constructing light-receiving modules including optical fibers.

The dark current of the photodiode was as small as 100 pA at a reverse bias of 3 V. Also, it was confirmed that the Zener breakdown voltage of the photodiode with an increased reverse bias voltage applied thereto was as high as 15 V. Further, the capacitance of the photodiode was 0.2 pF, and it was found that the high-frequency response was as high as 20 GHz at a −3 dB point.

As another embodiment of the present invention, a photodiode designed exclusively for receiving light with a wavelength of 1.55 μm was fabricated in the following manner. In this case, GaInAsP having a band gap wavelength of 1.35 μm was used for the optical confinement layers 13 and 15, so that the relative index difference between the optical confinement layer 13, 15 and the optical absorption layer 14 was small. This is effective in reducing the optical confinement factor Γ of the optical waveguide. Also, the reduction in the optical confinement factor Γ of the optical waveguide induces a corresponding enlargement of the spot size of the guided light, whereby the loss of coupling with an optical fiber can effectively be reduced.

Figure 8A:
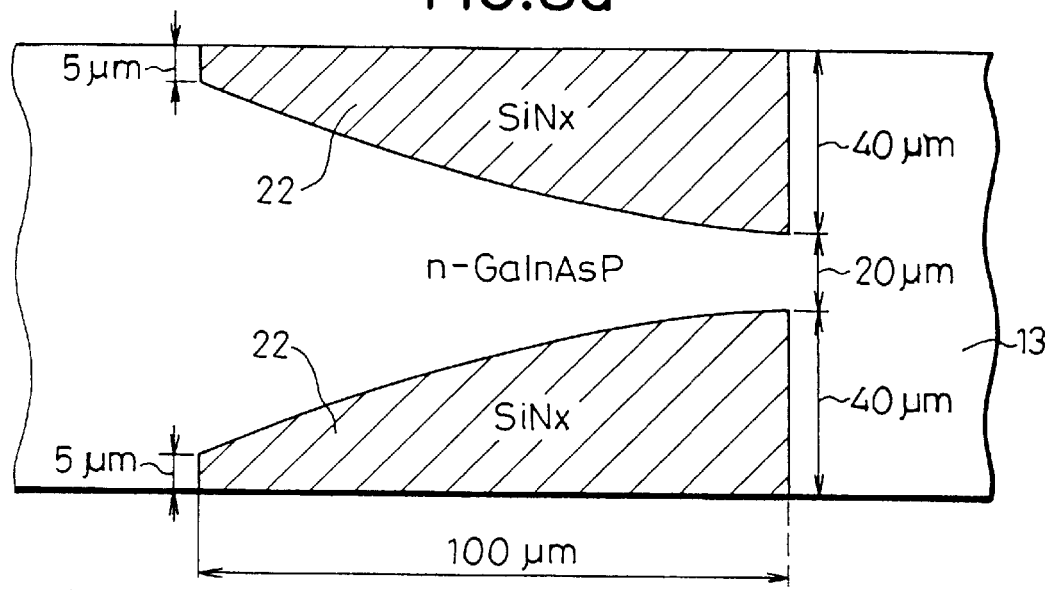
FIGS. 8a, 8b and 8c repectively are diagrams showing a pattern of a pair of masks used in producing a photodiode according to another embodiment of the present invention, change in the thickness of the optical absorption layer selectively grown by means of the masks, and change in the optical confinement factor.

Basically, the photodiode of this embodiment is fabricated following the same procedure as employed in the foregoing embodiment. However, in this embodiment, a pair of masks 22 used to selectively grow the optical absorption layer 14 had a mask pattern as shown in FIG. 8a. The masks 22 also are formed in such a manner that a light receiving area of 20 μm wide and 100 μm long is situated between the pair of masks. The pattern of the masks 22 is in this case such that the mask width Wm gradually varies from 5 μm at the light incident end to 40 μm at the other terminal end, thus defining a generally trapezoidal area.

Figure 8B:
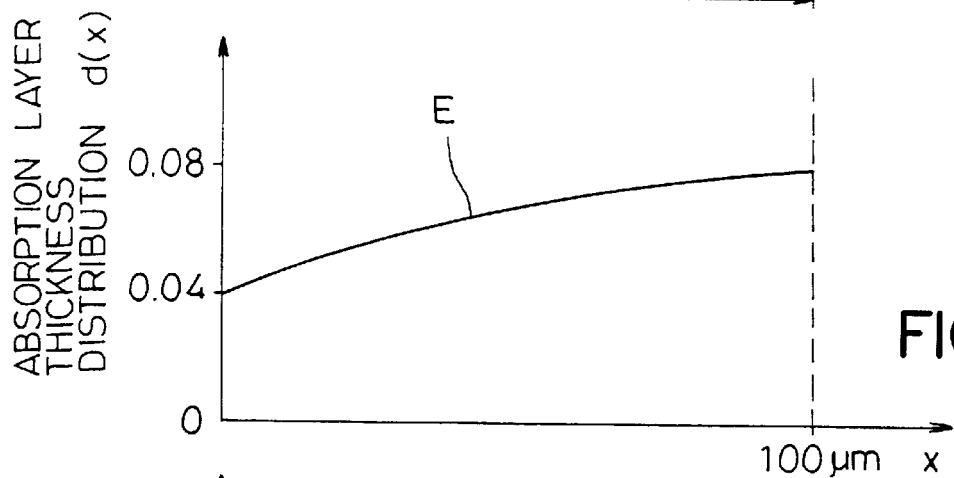
Figure 8C:
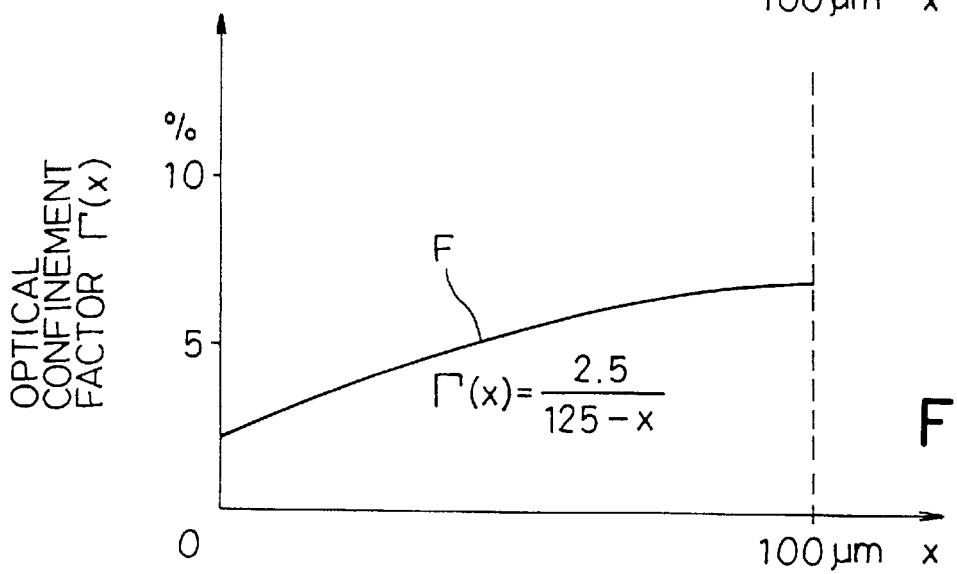

Using the masks 22, the GaInAs optical absorption layer 14 was formed by crystal growth on the optical confinement layer 13 so that the film thickness thereof at the light incident end might be 0.04 μm. The optical absorption layer 14 formed in this case had a film thickness distribution characteristic E shown in FIG. 8b, proving that the film thickness gradually varied up to about 0.08 μm at the terminal end. Also, it was confirmed by calculation that the optical confinement factor Γ(x) of the optical waveguide had a characteristic F shown in FIG. 8c.

Then, following the same procedure as employed in the foregoing embodiment, the photodiode with a stripe length of 100 μm was produced. The modulation distortion of the thus-obtained photodiode was measured in the same manner as in the foregoing embodiment, and it was found that the second- and third-order modulation distortions of the photodiode were −80 dBc and −110 dBc on the average. Compared with the foregoing embodiment, this photodiode had a greater stripe length and the optical absorption layer 14 had a smaller thickness; therefore, the capacitance of the photodiode was slightly higher and was found to be 0.5 pF at a maximum. The photodiode had a slightly lower high-frequency response of 10 GHz at a −3 dB point, yet proving that the photodiode had sufficient practicality.

The present invention is not limited to the embodiments described above. Although in each of the above embodiments GaInAsP is used for the optical confinement layers, other materials having large band gap energy as compared with the optical absorption layer, such as AlGaInAs, may also be used for the optical confinement layers. Further, the present invention is of course applicable to the case where a photodiode is formed on a GaAs substrate. Thus, various modifications can be made without departing from the scope or spirit of the invention.

What is claimed is:

1. A photodiode comprising a plurality of semiconductor layers formed one upon another on a semiconductor substrate, said plurality of semiconductor layers including an optical absorption layer and a pair of optical confinement layers sandwiching said optical absorption layer therebetween, said optical absorption layer sandwiched between said pair of optical confinement layers forming an optical waveguide area for light incident thereon in parallel with said semiconductor layers, said optical absorption layer having a waveguide structure in which a thickness d(x) of said optical absorption layer gradually increases with distance x from a light incident front facet of said optical waveguide area and a light absorption quantity per unit length of said optical waveguide area is substantially constant over an entire area of said optical waveguide area.

2. A photodiode comprising a plurality of semiconductor layers formed one upon another on a semiconductor substrate, said plurality of semiconductor layers including an optical absorption layer and a pair of optical confinement layers sandwiching said optical absorption layer therebetween, said optical absorption layer sandwiched between said pair of optical confinement layers forming an optical waveguide area for light incident thereon in parallel with said semiconductor layers, said optical absorption layer having a waveguide structure in which a thickness d(x) of said optical absorption layer gradually increases in a light guiding direction such that an optical confinement factor Γ(x) increases with distance x from a light incident front facet of said optical waveguide area and a light absorption quantity per unit length of said optical waveguide area is substantially constant over an entire area of said optical waveguide area.

3. The photodiode according to claim 1, wherein the thickness d(x) of said optical absorption layer is set as follows:

$$d(x) = \frac{C_3}{C_4 - x}$$

where $C_3$ and $C_4$ are constants.

4. The photodiode according to claim 2, wherein the optical confinement factor Γ(x) is set as follows:

$$\Gamma(x) = \frac{C_1}{C_2 - x}$$

where $C_1$ and $C_2$ are constants.

* * * * *